(12) United States Patent
Balmefrezol et al.

(10) Patent No.: US 7,564,231 B2
(45) Date of Patent: Jul. 21, 2009

(54) SWITCHING POWER SUPPLY SOURCE

(75) Inventors: Alexandre Balmefrezol, Sassenage (FR); Jean-Luc Patry, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/026,098

(22) Filed: Feb. 5, 2008

(65) Prior Publication Data
US 2008/0129262 A1 Jun. 5, 2008

Related U.S. Application Data

(63) Continuation of application No. 11/366,081, filed on Mar. 2, 2006, now abandoned.

(30) Foreign Application Priority Data

Mar. 4, 2005 (FR) .................................. 05 02222

(51) Int. Cl.
*G05F 1/40* (2006.01)
(52) U.S. Cl. ..................... 323/282; 323/225; 323/284
(58) Field of Classification Search ................ 323/222, 323/225, 282, 284, 351
See application file for complete search history.

(56) References Cited

U.S. PATENT DOCUMENTS

| 5,422,562 | A | 6/1995 | Mammano et al. |
| 5,751,139 | A | 5/1998 | Jordan et al. |
| 6,605,930 | B2 * | 8/2003 | Hwang ........................ 323/225 |
| 7,030,596 | B1 * | 4/2006 | Salerno et al. .............. 323/282 |
| 7,230,406 | B2 | 6/2007 | Huang et al. |
| 2004/0070377 | A1 | 4/2004 | Bai et al. |
| 2004/0207372 | A1 | 10/2004 | Yoshikawa |
| 2005/0258890 | A1 * | 11/2005 | Miyazaki ..................... 327/427 |

OTHER PUBLICATIONS

French Search Report from corresponding French Application No. 0502222, filed Mar. 4, 2005.

* cited by examiner

*Primary Examiner*—Jessica Han
(74) *Attorney, Agent, or Firm*—Lisa K. Jorgenson; James H. Morris; Wolf, Greenfield & Sacks, P.C

(57) ABSTRACT

A switching power supply source including an inductance with first and second terminals; an output node; an NMos transistor, the drain of which is connected to the first terminal; a PMos transistor, the drain of which is connected to the first terminal; a control device generating control signals for NMos and PMos transistors assuring that these transistors are not conducting simultaneously; a capacitor with a third terminal connected to the first terminal and a fourth terminal; a resistance with a fifth terminal connected to the fourth terminal and a sixth terminal; and an NMos transistor the drain of which is connected to the grid of the PMos transistor and the gate of which is connected to the fourth terminal.

19 Claims, 1 Drawing Sheet

Fig. 1
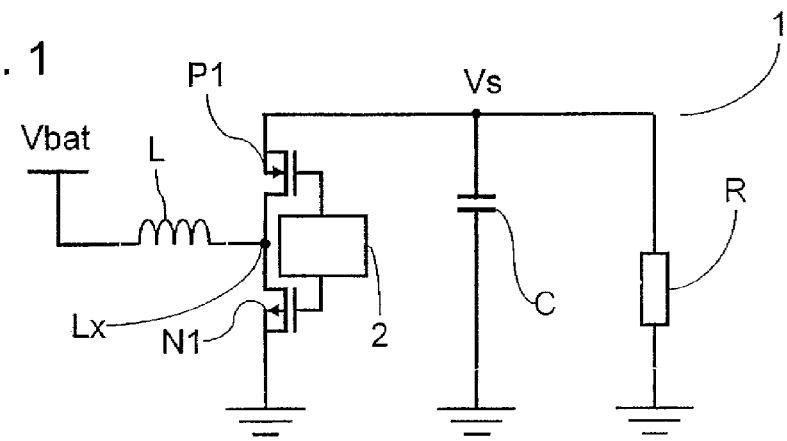
Fig. 2
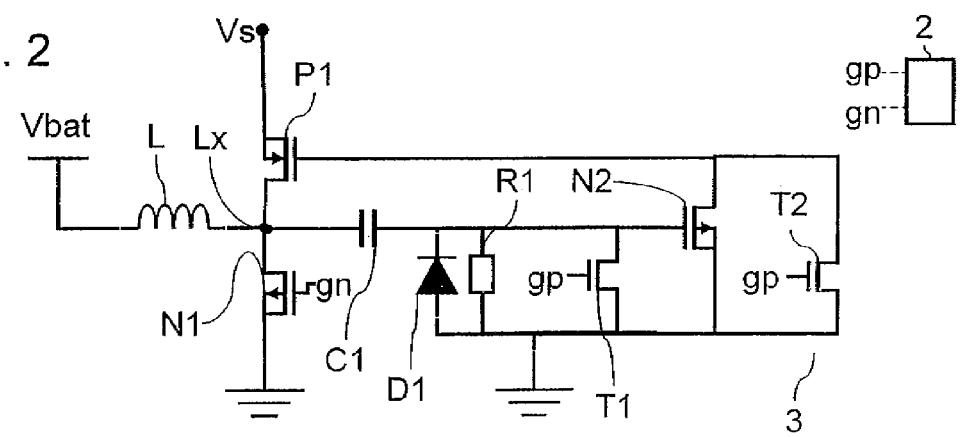
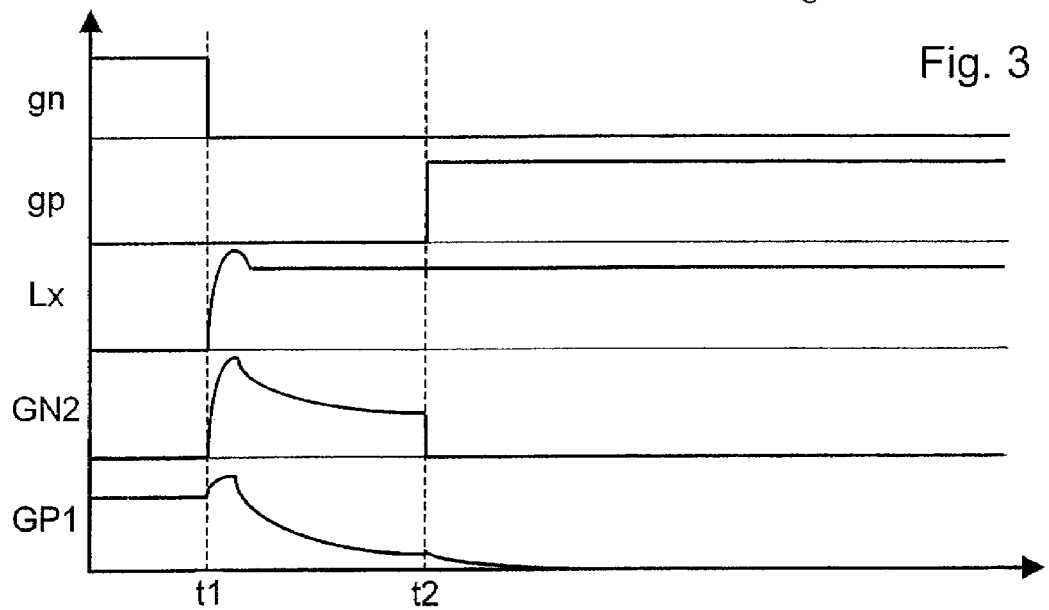
Fig. 3

SWITCHING POWER SUPPLY SOURCE

CROSS REFERENCE TO RELATED APPLICATIONS

This application is a continuation of U.S. application Ser. No. 11/366,081, filed Mar. 2, 2006 now abandoned entitled SWITCHING POWER SUPPLY SOURCE, which application is incorporated herein by reference in its entirety.

BACKGROUND OF INVENTION

1. Field of Invention

The invention relates to switching power supply sources in general and particularly switching power supply sources with an inductance for which the voltage level is defined by two control switches.

2. Discussion of Related Art

FIG. 1 illustrates a switching power supply source 1 according to the state of the art. This switching power supply 1 is a DC-DC step up voltage converter like that described in document FR-2 841 061. The switching power supply source 1 has an inductance L connected firstly to a DC power supply source Vbat and secondly to an intermediate node Lx. The source of an NMos transistor N1 is connected to the ground and its drain is connected to the node Lx. The drain of a PMos transistor P1 is connected to the node Lx and its source is connected to the output Vs from the switching power supply 1. A load R to be powered and a capacitor C are connected in parallel between the output Vs and the ground. A switching power supply control device 2 is connected to the gates of the transistors P1 and N1. The control device 2 controls transistor P1 and N1 such that one is blocked (non-conducting) when the other is conducting, so as to prevent current passing through the inductance becoming negative. To prevent transistors P1 and N1 from conducting simultaneously when one transistor is blocked, the other transistor is held blocked for a period usually between 20 and 100 ns before it is made conducting.

During the transient phase in which the two transistors are blocked, the energy stored in the inductance is dissipated in the substrate through the parasite PNP transistor intrinsically formed by transistor P1 when using CMOS technology. This current dissipation into the substrate reduces the energy efficiency of the switching power supply. Furthermore, this current can disturb operation of other devices integrated into the substrate. Moreover, when the parasite PNP transistor formed by P1 is conducting, the intermediate node Lx experiences an overvoltage that can reduce the reliability of the transistor N1. The invention is intended to solve one or several of these disadvantages.

SUMMARY OF INVENTION

The invention thus relates to a switching power supply source comprising:

an inductance with first and second terminals;

an output node;

an NMos transistor, the source of which is connected to the ground and the drain of which is connected to the first electrode of the inductance;

a PMos transistor, the drain of which is connected to the first electrode of the inductance;

a switching power supply control device generating switching control signals for NMos and PMos transistors capable of assuring that these transistors are not conducting simultaneously;

a capacitor with a first terminal connected to the first terminal of the inductance and a second terminal;

a resistance with a first terminal connected to the second terminal of the capacitor and a second terminal connected to the ground;

a detection NMos transistor, the source of which is connected to the ground, the drain of which is connected to the gate of the PMos transistor, and the gate of which is connected to the second terminal of the capacitor.

According to one variant:

the second terminal of the inductance is connected to a DC power supply source;

the source of the PMos transistor is connected to the output node.

According to another variant, there is at least one other output node and at least one other PMos transistor, the drain of which is connected to the first electrode of the inductance, the source of which is connected to the other output node and the gate of which is connected to the drain of the detection NMos transistor.

According to yet another variant, the switching power supply source also comprises a blocking transistor with a first electrode connected to the ground, a second electrode connected to the gate of the detection NMos transistor and a control electrode; the switching power supply control device making the blocking transistor conducting when the detection NMos transistor is conducting.

According to another variant, the switching power supply source also comprises a control transistor with a first electrode connected to the ground, a second electrode connected to the gate of the PMos transistor and a control electrode; the switching power supply control device controlling simultaneous conduction of the control transistor and the blocking transistor.

The transistors, the capacitor and the resistance may be integrated on the same substrate.

BRIEF DESCRIPTION OF DRAWINGS

Other characteristics and advantages of the invention will become clear after reading the description given below for information and that is in no way limitative, with reference to the attached drawings in which:

FIG. 1 illustrates a voltage step up switching power supply according to prior art;

FIG. 2 illustrates an example voltage step up switching power supply according to the invention;

FIG. 3 shows a timing diagram representing operation of the switching power supply to make its PMos transistor conducting.

DETAILED DESCRIPTION

The invention detects blocking switching of the NMos transistor and to make the PMos transistor conducting when this detection occurs. Blockage of the NMos transistor creates an overvoltage at the PMos and NMos transistor drains. An RC circuit connected to the drains of the PMos and NMos transistors makes the detection NMos transistor conducting when the overvoltage occurs. When the detection NMos transistor is conducting, the PMos transistor is also made conducting.

The invention assures conduction of the PMos transistor as soon as the blockage of the NMos transistor is detected. Thus, the time during which the NMos transistor and the PMos transistor are blocked simultaneously is particularly low. Consequently, the conduction time in the substrate through the parasite transistor is also low, which increases the efficiency of the switching power supply and limits any disturbances to other integrated circuits. These results are also obtained without making use of a comparator circuit with a low response time, which would increase the cost and difficulties of integrating the switching power supply.

FIG. 2 shows a switching power supply source 3 forming a voltage step up DC-DC converter. An inductor L has a first electrode connected to an intermediate node Lx and a second electrode connected to a DC power supply source Vbat. An NMos transistor N1 has its source connected to the ground and its drain connected to the intermediate node Lx. A PMos transistor P1 has its source connected to an output node Vs and its drain is connected to the intermediate node Lx. The first terminal of a capacitor C1 is connected to the intermediate node Lx and its second terminal is connected to the gate of an NMos transistor N2. The source of transistor N2 is connected to the ground and its drain is connected to the gate of transistor P1. A diode D1, a resistor R1 and a transistor T1 are connected in parallel between the gate of the transistor N2 and the ground. A transistor T2 has a first electrode connected to the ground and a second electrode connected to the gate of transistor P1. A switching power supply control device 2 generates control signals gp and gn. These control signals are designed to control switching of transistors N1 and P1 so as to define the voltage level on the output node Vs, while preventing the transistors N1 and P1 from being conducting simultaneously. The signal gn is applied to the gate of transistor N1 atimend the signal gp is applied to the control electrodes of transistors T1 and T2.

Operation of the switching power supply 3 when the transistor N1 is blocked is illustrated in FIG. 3.

Before time t1, transistor N1 is conducting, its gate being polarized by the signal gn at high level. The signal gp is low and thus transistors T1 and T2 are blocked. Transistor N2 is blocked by the low level applied to its gate (signal GN2). Transistor P1 is blocked by the high level applied to its gate (signal GP1).

At time t1, the control device 2 generates a falling front of the signal gn, blocking the transistor N1. An overvoltage is then generated on the intermediate node Lx. A current then passes through the capacitor C1 and the resistor R1. The voltage GN2 then increases and makes the transistor N2 conducting. The voltage Gp1 then drops and the transistor P1 becomes conducting. Thus, an overvoltage on the intermediate node Lx makes the transistor P1 conducting.

A rising front of the signal gp is generated at time t2, so as to block the transistor N2 quickly while transistor P1 remains conducting. Transistors T1 and T2 are thus made conducting. The gate of N2 is then connected to the ground and the transistor N2 blocks. The transistor T2 that is conducting keeps transistor P1 conducting.

The inventors have determined that the invention provides a means of obtaining a time shorter than 5 ns between when N1 is blocked and when P1 is made conducting. During the period between when P1 is made conducting and time t2, the power dissipated in transistor N2 is significantly less than the power dissipated in the substrate according to prior art. The efficiency of the switching power supply is thus improved.

The invention is particularly suitable for a switching power supply source with several outputs. Thus, it will be possible for the voltage step up converter illustrated above to have several output nodes. Each output node is connected to the source of a corresponding PMos transistor, the drain of this transistor being connected to the intermediate node Lx. The drain of transistor N2 is connected to the gate of each PMos transistor. Thus, an overvoltage on the intermediate node Lx makes all PMos transistors associated with the output nodes conducting.

Those skilled in the art will note that the solution according to the invention can be implemented with standard components, which makes it easy to integrate them into the same substrate as the switching power supply transistors.

Although the example described deals only with a voltage step up converter, those skilled in the art could easily adapt it to create a voltage step down converter based on the description given above.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. Switching power supply source comprising:
   an inductor comprising first and second terminals;
   an output node;
   an NMos transistor, a source of which is connected to a ground and a drain of which is connected to a first terminal of the inductor;
   a PMos transistor, a drain of which is connected to the first terminal of the inductor;
   a switching power supply control device generating switching control signals for the NMos and PMos transistors, the control signals are capable of assuring that the NMos and PMos transistors are not conducting simultaneously;
   a capacitor with a first terminal connected to the first terminal of the inductor and a second terminal;
   a resistor with a first terminal of the resistor connected to the second terminal of the capacitor, and a second terminal of the resistor connected to the ground; and
   a detection NMos transistor, a source of which is connected to the ground, a drain of which is connected to a gate of the PMos transistor, and a gate of which is connected to the second terminal of the capacitor.

2. Switching power supply source according to claim 1, wherein
   the second terminal of the inductor is connected to a DC power supply source; and
   the source of the PMos transistor is connected to the output node.

3. Switching power supply source according to claim 2, further comprising at least one other output node and at least one other PMos transistor, wherein
   a drain of the at least one other PMos transistor is connected to the first terminal of the inductor,
   a source of the at least one other PMos transistor is connected to the at least one other output node, and
   a gate of the at least one other PMos transistor is connected to the drain of the detection NMos transistor.

4. Switching power supply source according to claim 1, further comprising:
   a blocking transistor with a first electrode connected to the ground, a second electrode connected to the gate of the detection NMos transistor, and a control electrode; wherein the switching power supply control device is making the blocking transistor conducting when the detection NMos transistor is blocked.

5. Switching power supply source according to claim 4, further comprising:
a control transistor with a first electrode connected to the ground, a second electrode connected to the gate of the PMos transistor, and a control electrode; wherein
the switching power supply control device is controlling simultaneous conduction of the control transistor and the blocking transistor.

6. Switching power supply source according to claim 1, wherein the NMos transistor, the PMos transistor, the NMos detection transistor, the capacitor and the resistor are integrated on the same substrate.

7. A switching power supply source comprising:
an inductor comprising a first terminal and a second terminal;
an output node;
an NMos transistor, wherein a first terminal of the NMos transistor is coupled to a reference voltage and a second terminal of the NMos transistor is coupled to a first terminal of the inductor;
a PMos transistor, wherein a second terminal of the PMos transistor is coupled to the first terminal of the inductor;
a switching power supply control device generating control signals for the NMos and PMos transistors, the control signals are capable of assuring that the NMos and PMos transistors are not conducting simultaneously;
a capacitor with a first terminal of the capacitor coupled to the first terminal of the inductor;
a resistor with a first terminal of the resistor coupled to a second terminal of the capacitor, and a second terminal of the resistor coupled to the reference voltage; and
a detection NMos transistor, wherein a first terminal of the detection NMos transistor is coupled to the reference voltage, a second terminal of the detection NMos transistor is coupled to a gate of the PMos transistor, and a gate of the detection NMos transistor is coupled to the second terminal of the capacitor.

8. The switching power supply source according to claim 7, wherein
the second terminal of the inductor is coupled to a DC power supply source; and
the first terminal of the PMos transistor is coupled to the output node.

9. The switching power supply source according to claim 8, further comprising at least one other output node and at least one other PMos transistor, wherein
a first terminal of the at least one other PMos transistor is coupled to the at least one other output node,
a second terminal of the at least one other PMos transistor is coupled to the first terminal of the inductor, and
a gate of the at least one other PMos transistor is coupled to the second terminal of the detection NMos transistor.

10. The switching power supply source according to claim 7, further comprising
a blocking transistor with a first electrode coupled to the reference voltage;
a second electrode coupled to the gate of the detection NMos transistor; and
a control electrode, wherein
the switching power supply control device is making the blocking transistor conducting when the detection NMos transistor is blocked.

11. The switching power supply source according to claim 10, further comprising
a control transistor with a first electrode coupled to the reference voltage;
a second electrode coupled to the gate of the PMos transistor; and
a control electrode, wherein
the switching power supply control device is controlling simultaneous conduction of the control transistor and the blocking transistor.

12. A method of operating a switching power supply source comprising an NMos transistor having a first and second terminals, a PMos transistor having a first and second terminals, and a detection NMos transistor integrated in a substrate, the method comprising:
detecting blocking of the NMos transistor;
making the PMos transistor conducting immediately after blocking of the NMos transistor is detected; and
creating an overvoltage at the second terminal of the NMos transistor and at the second terminal of the PMos transistor when blocking of the NMos transistor is detected, wherein when the overvoltage is created the detection NMos and PMos transistors are conducting.

13. The method of claim 12, wherein current dissipation into the substrate is reduced.

14. The method of claim 12, wherein
the first terminal of the NMos transistor is coupled to a reference voltage,
the second terminal of the NMos transistor is coupled to a first terminal of an inductor of the switching power supply source,
the first terminal of the PMos transistor is coupled to an output node of the switching power supply source, and
the second terminal of the PMos transistor is coupled to the first terminal of the inductor.

15. The method of claim 14, further comprising providing at least one other output node and at least one other PMos transistor of the switching power supply source, wherein
a first terminal of the at least one other PMos transistor is coupled to the at least one other output node,
a second terminal of the at least one other PMos transistor is coupled to the first terminal of the inductor, and
a gate of the at least one other PMos transistor is coupled to the detection NMos transistor.

16. The method of claim 12, wherein the switching power supply source comprises blocking and control transistors, the method further comprises controlling simultaneous conduction of the blocking and control transistors.

17. The method of claim 16, further comprising:
coupling a gate of the detection NMos transistor to a reference voltage to block the detection NMos transistor; and
making the control transistor conducting to keep the PMos transistor conducting.

18. The method of claim 16, further comprising:
providing a first signal to a gate of the NMos transistor at a high level so that the NMos transistor is conducting;
providing a second signal to the blocking and control transistors at a low level so that the blocking and control transistors are blocked;

blocking the detection NMos transistor by a low level signal applied to a gate of the detection NMos transistor; and blocking the PMos transistor by a high level signal applied to a gate of the PMos transistor.

19. The method of claim 18, further comprising:

generating a falling front of the first signal to block the NMos transistor;

when the NMos transistor is blocked, creating an overvoltage at the second terminal of the NMos transistor and the second terminal of the PMos transistor;

generating a rising front of the second signal to immediately block the detection NMos transistor while the PMos transistor is conducting; and making the blocking and control transistors conducting.

* * * * *

UNITED STATES PATENT AND TRADEMARK OFFICE
CERTIFICATE OF CORRECTION

PATENT NO. : 7,564,231 B2  
APPLICATION NO. : 12/026098  
DATED : July 21, 2009  
INVENTOR(S) : Alexandre Balmefrezol et al.

Page 1 of 1

It is certified that error appears in the above-identified patent and that said Letters Patent is hereby corrected as shown below:

Col. 3, line 29, should read:
--and the signal gp is applied to the control electrodes of--

Signed and Sealed this

First Day of September, 2009

David J. Kappos
*Director of the United States Patent and Trademark Office*